(12) United States Patent
Choi et al.

(10) Patent No.: US 9,029,844 B2
(45) Date of Patent: May 12, 2015

(54) ORGANIC LIGHT EMITTING DIODE DISPLAY AND MANUFACTURING METHOD THEREOF

(71) Applicants: Jung-Ho Choi, Yongin (KR); Yang-Wan Kim, Yongin (KR)

(72) Inventors: Jung-Ho Choi, Yongin (KR); Yang-Wan Kim, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 0 days.

(21) Appl. No.: 13/911,136

(22) Filed: Jun. 6, 2013

(65) Prior Publication Data

US 2014/0124751 A1    May 8, 2014

(30) Foreign Application Priority Data

Nov. 5, 2012  (KR) .......................... 10-2012-0124315

(51) Int. Cl.
    *H01L 51/50* (2006.01)
    *H01L 27/32* (2006.01)

(52) U.S. Cl.
    CPC ......... *H01L 27/3246* (2013.01); *H01L 51/5012* (2013.01)

(58) Field of Classification Search
    CPC ... H01L 27/32; H01L 27/3206; H01L 27/322; H01L 27/3223; H01L 27/3211; H01L 27/3213; H01L 27/3216; H01L 27/3218; H01L 27/3202; H01L 27/3204; H01L 27/3209; H01L 27/3225; H01L 27/3227; H01L 27/323; H01L 27/3232; H01L 27/3234

USPC ............. 257/40, E51.001, E51.002, E51.018, 257/E51.019, E51.02, E51.021, E51.022
See application file for complete search history.

(56) References Cited

U.S. PATENT DOCUMENTS

| 7,554,116 | B2 * | 6/2009 | Yamazaki et al. ............... 257/59 |
| 7,592,980 | B2 * | 9/2009 | Yamazaki et al. ............... 345/76 |
| 7,903,055 | B2 * | 3/2011 | Nishikawa et al. .............. 345/77 |
| 8,242,692 | B2 * | 8/2012 | Kim et al. ....................... 313/507 |
| 2009/0243464 | A1 * | 10/2009 | Yamazaki et al. ............. 313/498 |
| 2011/0101359 | A1 * | 5/2011 | Kim et al. ........................ 257/59 |
| 2013/0049028 | A1 * | 2/2013 | Kim et al. ........................ 257/88 |
| 2013/0175514 | A1 * | 7/2013 | Han et al. ......................... 257/40 |

FOREIGN PATENT DOCUMENTS

| KR | 10-2006-0027743 A | 3/2006 |
| KR | 10-2010-0024672 A | 3/2010 |
| KR | 10-2011-0049578 A | 5/2011 |
| KR | 10-2011-0094460 A | 8/2011 |

* cited by examiner

*Primary Examiner* — Eva Y Montalvo
*Assistant Examiner* — Samuel Lair
(74) *Attorney, Agent, or Firm* — Lee & Morse, P.C.

(57) ABSTRACT

An organic light emitting diode display and a method of manufacturing the same, the display including a substrate; a plurality of thin film transistors on the substrate; a protective film covering the plurality of thin film transistors; a pixel electrode on the protective film; a pixel defining film on the protective film, the pixel defining film having an opening exposing the pixel electrode; an organic emission layer on the pixel electrode and the pixel defining film; and a common electrode covering the organic emission layer, wherein a cross-section of an opening sidewall of the opening in the pixel defining film has a rounded shape.

13 Claims, 6 Drawing Sheets

ORGANIC LIGHT EMITTING DIODE DISPLAY AND MANUFACTURING METHOD THEREOF

RELATED APPLICATIONS

This application claims priority to and the benefit of Korean Patent Application No. 10-2012-0124315 filed in the Korean Intellectual Property Office on Nov. 5, 2012, the entire contents of which are incorporated herein by reference.

BACKGROUND

1. Field

Embodiments relate to an organic light emitting diode display and a manufacturing method thereof.

2. Description of the Related Art

An organic light emitting diode display includes two electrodes and an organic light emitting member disposed therebetween. Electrons injected from one electrode and holes injected from the other electrode are combined in the organic light emitting member to form excitons. Light is then emitted as the excitons release energy.

The above information disclosed in this Background section is only for enhancement of understanding of the background of the described technology and therefore it may contain information that does not form the prior art that is already known in this country to a person of ordinary skill in the art.

SUMMARY

An exemplary embodiment provides an organic light emitting diode display including: a substrate; a plurality of thin film transistors formed on the substrate; a protective film covering the plurality of thin film transistors; a pixel electrode formed on the protective film; a pixel defining film having an opening exposing the pixel electrode and formed on the protective film; an organic emission layer formed on the pixel electrode and the pixel defining film; and a common electrode covering the organic emission layer, wherein a cross-section of an opening sidewall constituting the opening of the pixel defining film may have a round shape.

A pixel protective film positioned under the pixel electrode may protrude.

The height of the pixel protective film may be greater than the height of a peripheral protective film positioned under the pixel electrode.

A cross-section of the opening sidewall may have a concave shape.

An angle of slope between a tangent at the opening sidewall and the surface of the pixel electrode may increase as the opening sidewall gets farther from a sidewall boundary contacting the pixel electrode.

A second angle of slope between a tangent at the opening sidewall far from the sidewall boundary may be larger than a first angle of slope between a tangent at the opening sidewall close to the sidewall boundary.

An exemplary embodiment provides a manufacturing method of an organic light emitting diode display, the method including: forming a plurality of thin film transistors on a substrate; forming a protective film covering the plurality of thin film transistors; forming a pixel electrode on the protective film; forming a pixel defining film having an opening exposing the pixel electrode on the protective film; forming an organic emission layer formed on the pixel electrode and the pixel defining film; and forming a common electrode covering the organic emission layer, wherein a cross-section of an opening sidewall constituting the opening of the pixel defining film may have a round shape.

A pixel protective film positioned under the pixel electrode may protrude.

A cross-section of the opening sidewall may have a concave shape.

The forming of an organic emission layer may include: disposing a transfer layer of a donor film so as to face the pixel defining film and the pixel electrode exposed through the opening; and irradiating a laser to the donor film to transfer the transfer layer of the donor film onto the pixel electrode.

DETAILED DESCRIPTION

Figure 1:
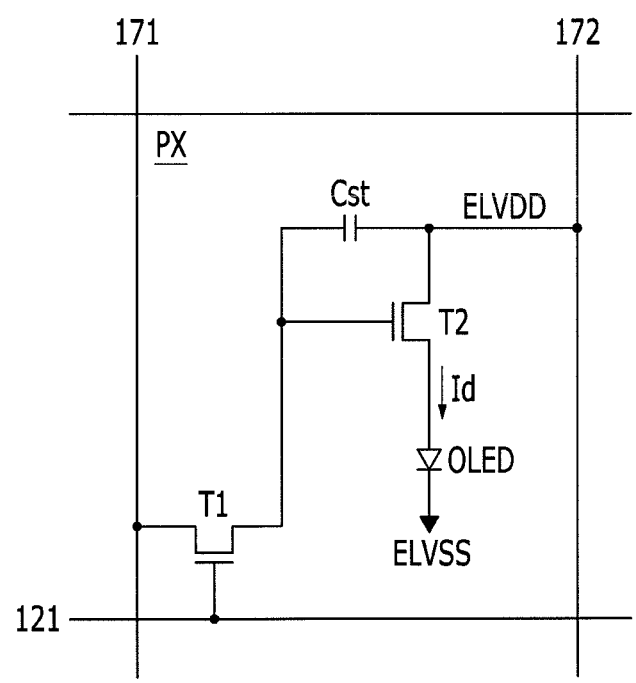
FIG. 1 illustrates an equivalent circuit diagram of an organic light emitting diode display according to an exemplary embodiment.

The embodiments will be described more fully hereinafter with reference to the accompanying drawings. As those skilled in the art would realize, the described embodiments may be modified in various different ways, all without departing from the spirit or scope thereof.

In order to clarify the description of the disclosed embodiments, elements extrinsic to their description may be omitted. Further, like reference numerals refer to like elements throughout the application.

In addition, sizes and thicknesses of the elements in the drawings are not necessarily to scale, but rather for better understanding and ease of description.

In the drawings, the thickness of layers, films, panels, regions, etc., may be exaggerated for clarity, e.g., the thicknesses of layers and regions may be exaggerated for convenience of explanation. It will be understood that when an element such as a layer, film, region, or substrate is referred to as being "on" another element, it can be directly on the other element or intervening elements may also be present.

Although the attached drawings illustrate an active matrix (AM) organic light emitting diode display having a 2Tr-1 Cap structure in which one pixel includes two thin film transistors and one capacitor, the embodiments are not limited thereto. Accordingly, one pixel of the organic light emitting diode display may have a plurality of thin film transistors and one or more capacitors, and may have various structures by further including additional wires or omitting the existing wires. As used herein, the term "pixel" may refer to the smallest unit used in displaying an image. The organic light emitting diode display displays an image through a plurality of pixels.

Now, an organic light emitting diode display according to an exemplary embodiment will be described in detail with reference to FIGS. 1 to 3.

FIG. 1 illustrates an equivalent circuit diagram of an organic light emitting diode display according to an exemplary embodiment. FIG. 2 illustrates a layout view of a pixel of an organic light emitting diode display according to an exemplary embodiment. FIG. 3 illustrates a cross-sectional view taken along line of FIG. 2.

As shown in FIG. 1, an organic light emitting diode display according to an exemplary embodiment may include a plurality of signal lines, 171, and 172 and a plurality of pixels PX connected to these signal lines and arranged substantially in a matrix.

The signal lines may include a plurality of scan lines 121 transmitting a scan signal (or gate signal), a plurality of data lines 171 transmitting a data signal and a plurality of driving voltage lines 172 transmitting a driving voltage. The scan lines 121 may extend substantially in a row direction and may be substantially parallel to each other, and the data lines 171 and the driving voltage lines 172 may extend substantially in a column direction and may be substantially parallel to each other. Each pixel PX may include a switching thin film transistor T1, a driving thin film transistor T2, a storage capacitor Cst, and an organic light emitting diode OLED.

The switching thin film transistor T1 may have a control terminal, an input terminal, and an output terminal. The control terminal may be connected to the scan line 121, the input terminal may be connected to the data line 171, and the output terminal may be connected to the driving thin film transistor T2. The switching thin film transistor T1 may transmit a data signal applied to the data line 171 to the driving thin film transistor T2 in response to a scan signal applied to the scan lines 121.

The driving thin film transistor T2 may also have a control terminal, an input terminal, and an output terminal. The control terminal may be connected to the switching thin film transistor T1, the input terminal may be connected to the driving voltage line 172, and the output terminal may be connected to the organic light emitting diode OLED. The driving thin film transistor T2 may cause output current Id to flow, which may vary in amplitude in accordance with a voltage applied between the control terminal and the output terminal.

The storage capacitor Cst may be connected between the control terminal and input terminal of the driving thin film transistor T2. The storage capacitor CSt may charge a data signal applied to the control terminal of the driving thin film transistor T2, and may maintain the data signal after the switching thin film transistor T1 is turned off.

The organic light emitting diode OLED may have an anode connected to the output terminal of the driving thin film transistor T2 and a cathode connected to a common voltage ELVSS. The organic light emitting diode OLED may display an image by emitting light with different intensity according to an output current Id of the driving thin film transistor T2.

The switching thin film transistor T1 and the driving thin film transistor T2 may be n-channel field effect transistors (FETs) or p-channel field effect transistors. The connection relationship among the thin film transistors T1 and T2, the storage capacitor Cst, and the organic light emitting diode OLED may vary.

A detailed structure of the pixel of the organic light emitting diode display of FIG. 1 will now be described in further detail with reference to FIGS. 2 and 3.

Figure 2:
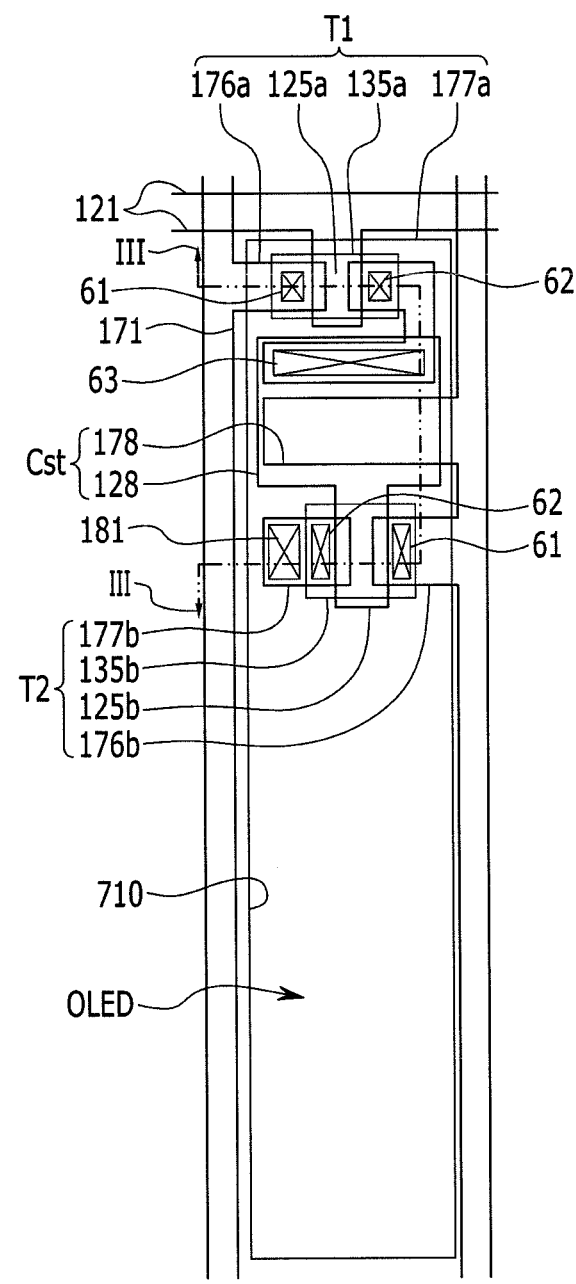
FIG. 2 illustrates a layout view of a pixel of an organic light emitting diode display according to an exemplary embodiment.
Figure 3:
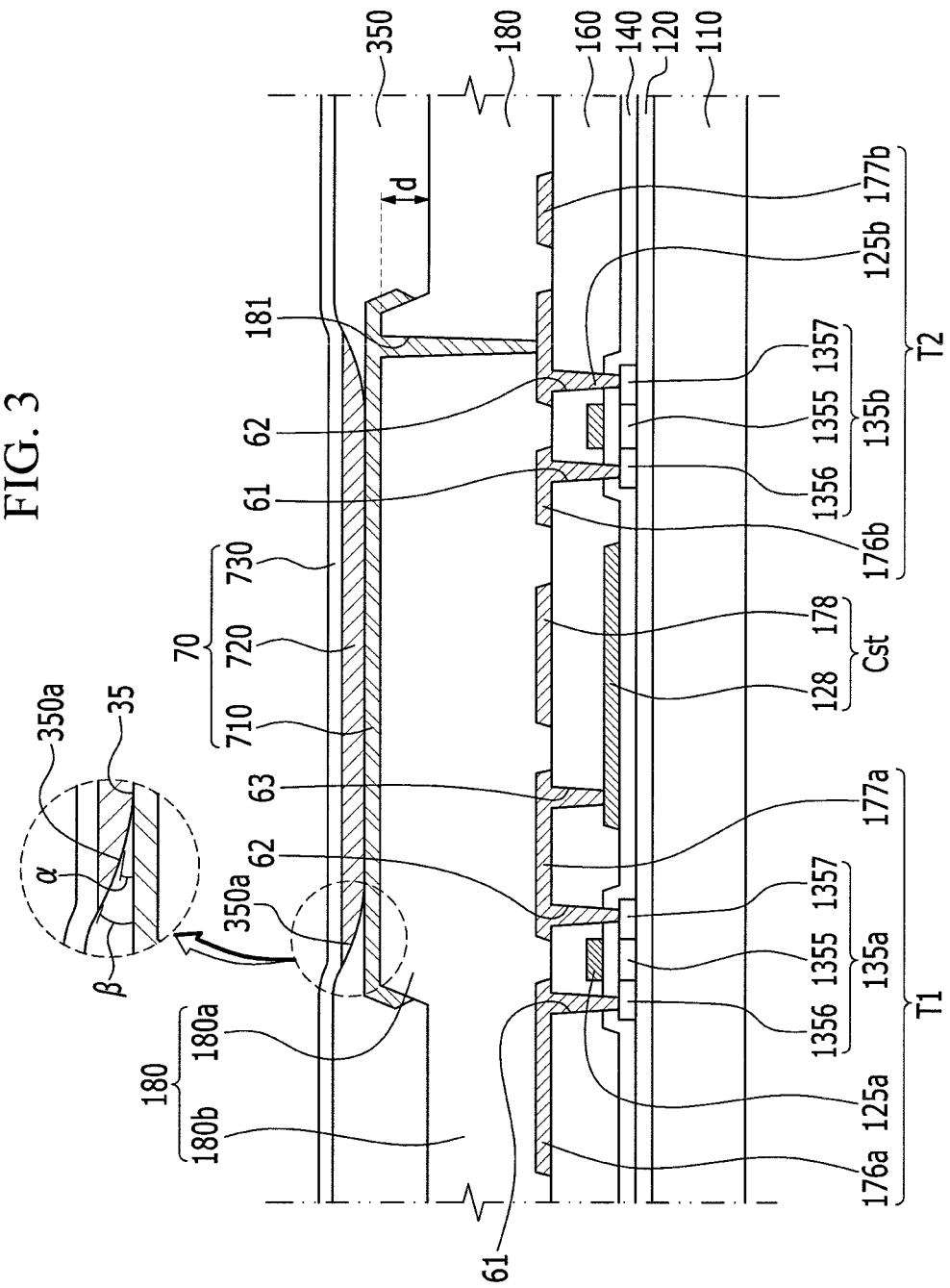
FIG. 3 illustrates a cross-sectional view taken along line of FIG. 2.

As shown in FIGS. 2 and 3, the organic light emitting display according to the exemplary embodiment may include a buffer layer 120 formed on a substrate 110. The substrate 110 may be an insulative substrate made of, e.g., glass, quartz, ceramic, plastic, or the like, or the substrate 110 may be a metal substrate made of, e.g., a stainless steel, or the like. The buffer layer 120 may have, e.g., a single-layer structure of silicon nitride ($SiN_x$), or a dual-layer structure of silicon nitride ($SiN_x$) and silicon oxide ($SiO_2$) laminated on each other. The buffer layer 120 may help prevent penetration of unnecessary elements, e.g., impurities or moisture, and may help planarize the surface.

A switching semiconductor layer 135a and a driving semiconductor layer 135b may be formed on the buffer layer 120, being spaced apart from each other. These semiconductor layers 135a and 135b may be made of, e.g., polysilicon or oxide semiconductor. The oxide semiconductor may contain one selected from the group of oxides based on titanium (Ti), hafnium (Hf), zirconium (Zr), aluminum (Al), tantalum (Ta), germanium (Ge), zinc (Zn), gallium (Ga), tin (Sn), or indium (In) and complex oxides thereof, such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-talaum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). If the semiconductor layers 135a and 135b are made of oxide semiconductor, a separate protective layer may be added to help protect the oxide semiconductor from the outside environment, e.g., from high temperature.

The semiconductor layers 135a and 135b may each include a channel region (not doped with impurities) and source and drain regions (doped with impurities) formed at both sides of the channel region. The impurities may vary according to the type of thin film transistors, and be, e.g., N-type impurities or P-type impurities.

The switching semiconductor layer 135a and the driving semiconductor layer 135b may each be divided into a channel region 1355 and a source region 1356 and a drain region 1357 formed at both sides of the channel region 135. The channel regions 1355 of the switching semiconductor layer 135a and the driving semiconductor layer 135b may include polysilicon not doped with impurities, e.g., an intrinsic semiconductor, and the source regions 1356 and drain regions 1357 of the switching semiconductor layer 135a and the driving semiconductor layer 135b may include polysilicon doped with conductive impurities, e.g., an impurity semiconductor.

A gate insulating film 140 may be formed on the switching semiconductor layer 135a and the driving semiconductor layer 135b. The gate insulating film 140 may be a single layer or plurality of layers containing at least one of silicon nitride and silicon oxide.

A scan line 121, a driving gate electrode 125b, and a first storage capacitor plate 128 may be formed on the gate insulating film 140. The scan line 121 may longitudinally extend in a horizontal direction and may transfer a scan signal, and may include a switching gate electrode 125a protruding from the scan line 121 toward the switching semiconductor layer 135a. The driving gate electrode 125b may protrude from the first storage capacitor plate 128 toward the driving semiconductor layer 135b. The switching gate electrode 125a and the driving gate electrode 125b may overlap or overlie the channel regions 1355, respectively.

An interlayer insulating film 160 may be formed on the scan line 121, the driving gate electrode 125b, and the first storage capacitor plate 128. Like the gate insulating film 140, the interlayer insulating film 160 may be formed of silicon nitride or silicon oxide.

Source contact holes 61 and drain contact holes 62 may be formed in the interlayer insulating film 160 and the gate insulating film 140 to expose the source regions 135b and the drain regions 135c, and storage contact holes 63 may be formed therein to expose part of the first storage capacitor 128.

A data line 171 having a switching source electrode 176a, a driving voltage line 172 having a driving source electrode 176b and a second storage capacitor plate 178, and a switching drain electrode 177a and a driving drain electrode 177b that are connected to the first storage capacitor plate 128 may be formed on the interlayer insulating film 160.

The data line 171 may transfer a data signal, and may extend in a direction crossing the gate line 121. The driving voltage line 172 may transfer a driving voltage, and may be separated from the data line 171 and may extend in the same direction as the data line.

The switching source electrode 176a may protrude from the data line 171 toward the switching semiconductor layer 135a, and the driving source electrode 176b may protrude from the driving voltage line 172 toward the driving semiconductor layer 135b. The switching source electrode 176a and the source electrode 176b may be respectively connected to the source regions 135b through the source contact holes 61. The switching drain electrode 177a may face the switching source electrode 176a, the driving drain electrode 177b may face the driving source electrode 176b, and the switching drain electrode 177a and the driving drain electrode 177b may be respectively connected to the drain regions 135c through the drain contact holes 62.

The switching drain electrode 177a may be extended and electrically connected to the first storage capacitor plate 128 and the driving gate electrode 125b through the storage contact holes 63 formed in the interlayer insulating film 160.

The second storage capacitor plate 178 may protrude from the driving voltage line 171, and may overlap or overlie the first storage capacitor plate 128. Accordingly, the first storage capacitor plate 128 and the second storage capacitor plate 178 may constitute the storage capacitor Cst by using the interlayer insulating film 160 as a dielectric material.

The switching semiconductor layer 135a, the switching gate electrode 125a, the switching source electrode 176a, and the switching drain electrode 177a may constitute the switching thin film transistor T1, and the driving semiconductor layer 135b, the driving gate electrode 125a, the driving source electrode 176b, and the driving drain electrode 177b may constitute the driving thin film transistor T2.

A protective film 180 may be formed on the switching source electrode 176a, the driving source electrode 176b, the switching drain electrode 177a, and the driving drain electrode 177b. The protective film 180 may include a pixel protective film 180a (positioned under or underlying the pixel electrode 710) and a peripheral protective film 180b positioned under or at a periphery of the pixel electrode. The pixel protective film 180a may protrude higher than the peripheral protective film 180b by a protrusion height d. For example, a height of the pixel protective film 180a from a surface of the substrate 110 may be greater than a height of the peripheral protective film 180b from the surface of the substrate by the protrusion height d.

The pixel electrode 710 may be formed on the pixel protective film 180 of the protective film 180. The pixel electrode 710 may be electrically connected to the driving drain electrode 177b of the driving thin film transistor T2 through a contact hole 181 formed in the interlayer insulating film 160 and may serve as an anode of the organic light emitting diode.

A pixel defining film 350 may be formed on edge portions of the protective film 180 and the pixel electrode 710. The pixel defining film 350 may have an opening 351 exposing the pixel electrode 710. The pixel defining film 180 may be made of a resin, e.g., polyacrylate resin or polyimide resin, a silica-based inorganic material, or the like.

The sidewall 350a of the opening or opening sidewall 350a (constituting the opening 351 of the pixel defining film 350) may be formed at a position corresponding to an edge portion of the pixel electrode 710. A cross-section of the sidewall 350a may have a concave rounded shape, and may be curved at a predetermined curvature, e.g., radius of curvature. The sidewall 350a may have a sidewall boundary 35 contacting the surface of the pixel electrode 710. For example, the sidewall boundary 35 may be where the sidewall 350a meets the surface of the pixel electrode 710. An angle of a slope between a tangent at the concave curved sidewall 350a and the surface of the pixel electrode 710 may increase as the opening sidewall 350a gets farther from the sidewall boundary 35. For example, a second angle β of a slope between a tangent at the opening sidewall 350a distal to the sidewall boundary 35 may be larger than a first angle α of a slope between a tangent at the opening sidewall 350a proximate to the sidewall boundary 35. This is because the opening sidewall 350a is curved to be concave.

As described above, the pixel protective film 180a may protrude higher than the peripheral protective film 180b by the protrusion height d. Thus, a cross-section of the opening sidewall 350a may have the concave rounded shape. Due to the concave rounded shape of the opening sidewall 350a, the organic emission layer 720 and the opening sidewall 350a (expanded and transferred in a convex shape) may be brought into close contact with each other and hence no space may be formed between them, thereby preventing the organic emission layer from coming off.

The organic emission layer 720 may be formed in the opening 351 of the pixel defining film 350. The organic emission layer 720 may be in close contact with the opening sidewall 350a having a concave rounded shape, especially, with the sidewall boundary 35 of the opening sidewall 350a. The organic emission layer 720 may be formed as a plurality of layers including one or more of an emission layer, a hole-injection layer HIL, a hole-transporting layer HTL, an electron-transporting layer ETL, and an electron-injection layer EIL. If the organic emission layer 720 includes all of the above-described layers, the hole-injection layer may be positioned on the pixel electrode 710 serving as an anode, and the hole-transporting layer, the emission layer, the electron-transporting layer, and the electron-injection layer may be sequentially laminated on the pixel electrode 710.

The organic emission layer 720 may include a red organic emission layer for emitting red light, a green organic emission layer for emitting green light, and a blue organic emission layer for emitting blue light. The red organic emission layer, the green organic emission layer, and the blue organic emission layer may be respectively formed in red, green, and blue pixels, thereby displaying a color image.

Moreover, the red organic emission layer, green organic emission layer, and blue organic emission layer of the organic emission layer 720 may be respectively laminated on the red pixel, green pixel and blue pixel, and a red color filter, a green color filter, and a blue color filter may be formed for the respective pixels, thereby displaying a color image. In an implementation, a white organic emission layer for emitting white light may be formed on all of the red, green, and blue pixels, and a red color filter, a green color filter, and a blue color filter may be formed for the respective pixels, thereby displaying a color image. If the white organic emission layer and the color filters are used to display a color image, there is no need to use a deposition mask for depositing the red, green, and blue organic emission layers on the respective pixels, i.e., the red, green, and blue pixels.

The white organic emission layer described in this example may be formed as one organic emission layer or a plurality of organic emission layers that are laminated to emit white light. For example, at least one yellow organic emission layer and at least one blue organic emission layer may be combined to emit white light, at least one cyan organic emission layer and at least one red organic emission layer may be combined to emit white light, or at least one magenta organic emission layer and at least one green organic emission layer may be combined to emit white light.

A common electrode 730 may be formed on the pixel defining film 350 and the organic emission layer 720. The common electrode 730 may be formed of a reflective film or semi-transmissive film including a reflective material. The reflective material constituting the reflective film or semi-transmissive film may be at least one metal selected from the group of Mg, Ag, Au, Ca, Li, Cr, and Al or an alloy thereof. The common electrode 730 may serve as a cathode of the organic light emitting diode OLED. The pixel electrode 710, the organic emission layer 720, and the common electrode 730 may constitute the organic light emitting diode 70.

A manufacturing method of the above-described organic light emitting diode display according to an exemplary embodiment will be described below in further detail with reference to FIGS. 4 to 6.

Figure 4:
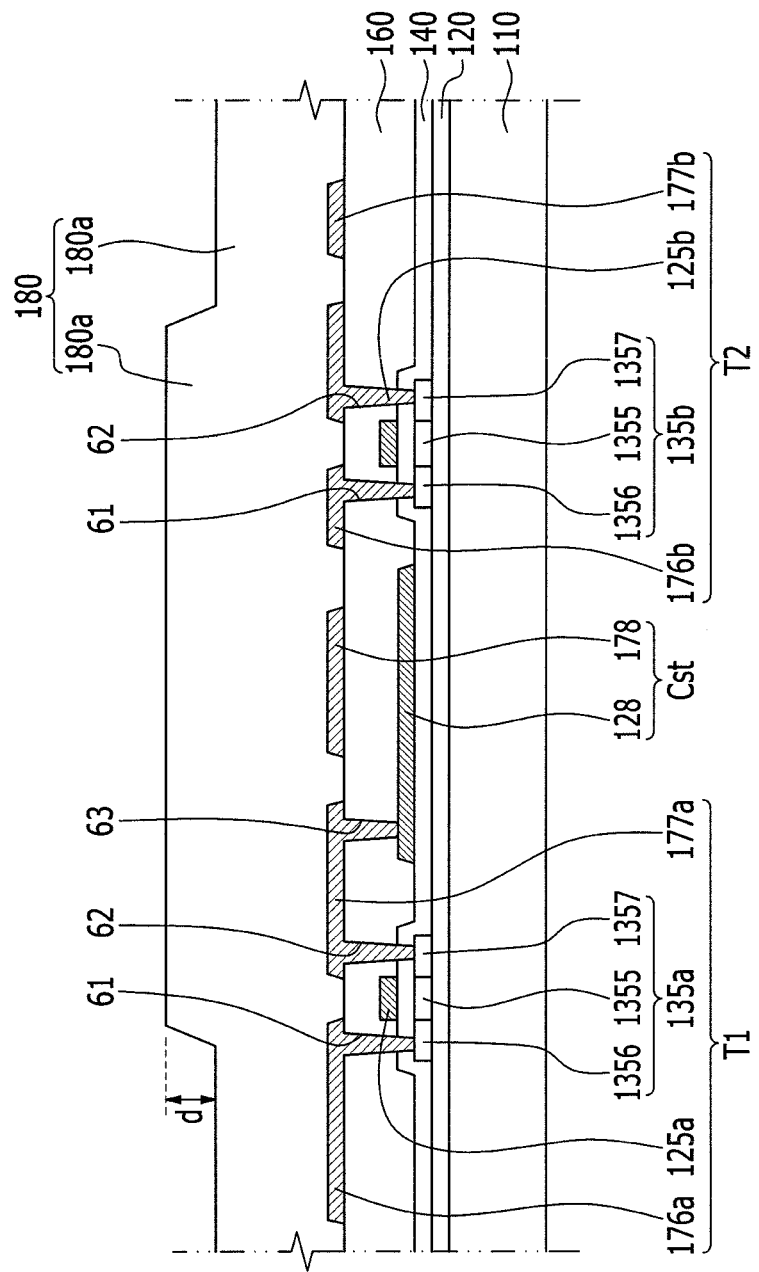
FIGS. 4 to 6 illustrate cross-sectional views of stages in a manufacturing method of an organic light emitting diode display according to an exemplary embodiment.
Figure 5:
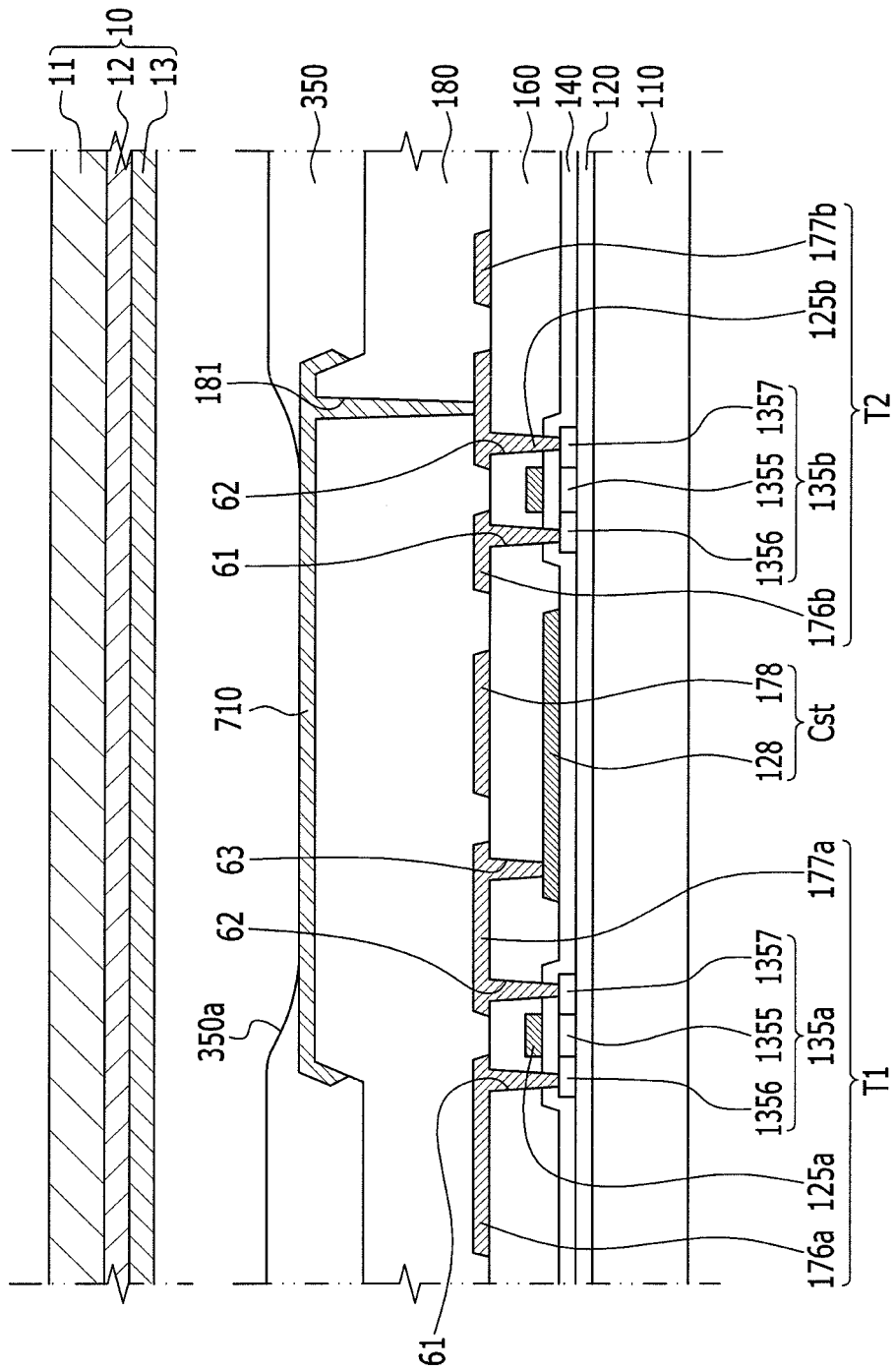
Figure 6:
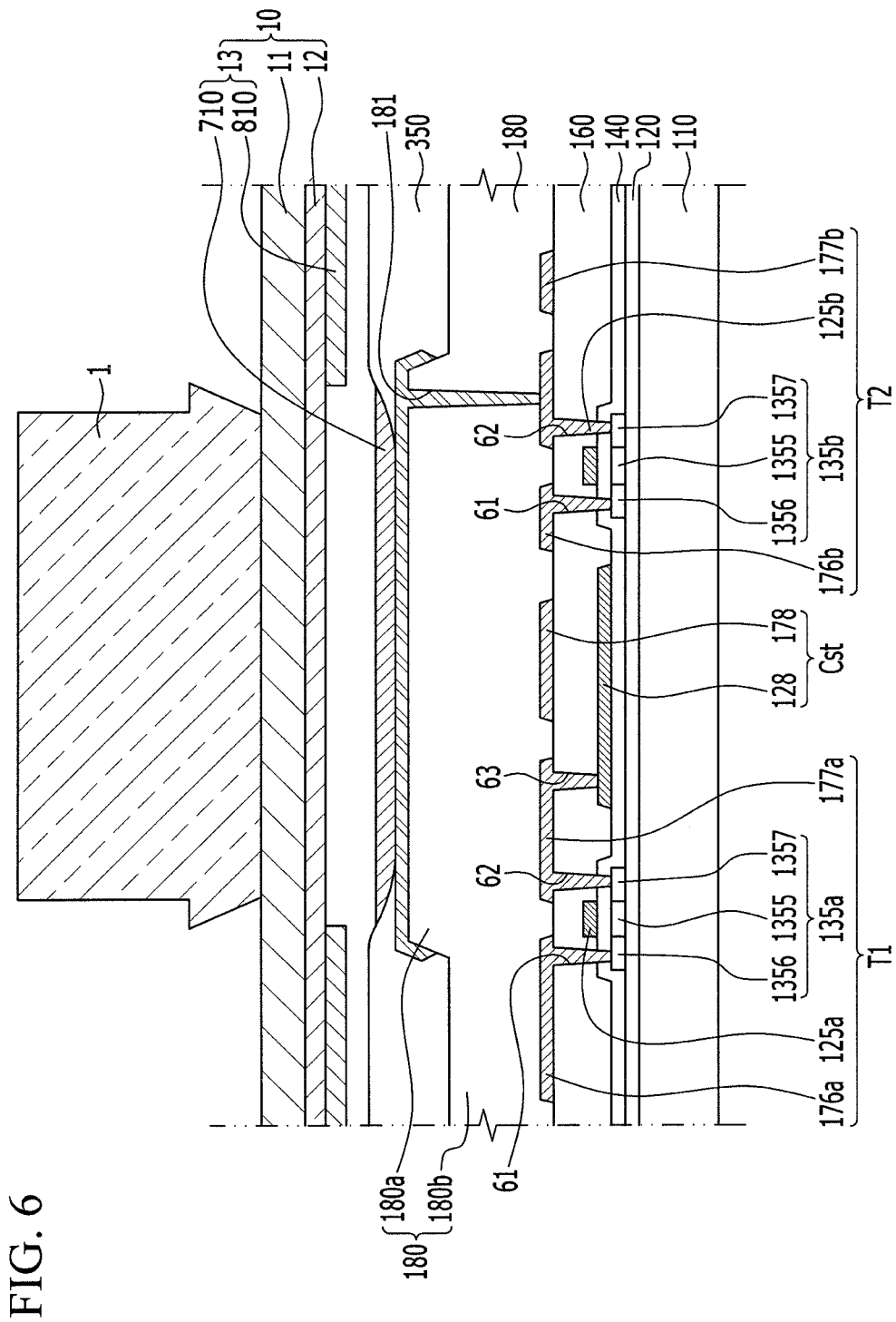

FIGS. 4 to 6 illustrate cross-sectional views of stages in a manufacturing method of an organic light emitting diode display according to an exemplary embodiment.

First of all, as shown in FIG. 4, a buffer layer 120 may be formed on a substrate 110. The buffer layer 120 may be deposited over the entire surface of the substrate 10 by a method such as plasma enhanced chemical vapor deposition PECVD. Next, a semiconductor layer may be formed on the buffer layer 120. The semiconductor layer may be made of polysilicon or oxide semiconductor, and the polysilicon may be formed by forming an amorphous silicon film and then crystallizing it. Various methods may be used to crystallize the amorphous silicon film, e.g., the amorphous silicon film may be crystallized using heat, a laser, Joule heat, an electrical field, a catalytic metal, or the like. Next, the semiconductor layer may be patterned by photolithography by using a first mask. As such, a switching semiconductor layer 135a and a driving semiconductor layer 135b may be simultaneously formed.

Next, a gate insulating film 140 may be formed on the switching semiconductor layer 135a and the driving semiconductor layer 135b. The gate insulating film 140 may be formed of silicon nitride ($SiN_x$) or silicon oxide ($SiO_2$), and may be deposited over the entire surface of the buffer layer 120 by a method such as PECVD.

Next, a gate metal layer may be formed on the gate insulating film 140. The gate metal layer may be formed as a multilayer film in which a metal film including one of copper (Cu), a copper alloy, aluminum (Al), and an aluminum alloy and a metal film including either one of molybdenum (Mo) and an molybdenum alloy are laminated. Next, the gate metal layer may be patterned by photolithography by using a second mask. As such, a switching gate electrode 125a may be formed at a position overlapping or overlying the switching semiconductor layer 135, a driving gate electrode 125b may be formed at a position overlapping or overlying the driving semiconductor layer 135b, and a first storage capacitor plate 128 may be formed to be connected to the driving gate electrode 125b. Next, the switching semiconductor layer 135a and the driving semiconductor layer 135b may be doped with impurities, and each of them may be divided into a channel region, a source region, and a drain region. The switching gate electrode 125a and the driving gate electrode 125b may help prevent the channel regions from being doped with impurities when the source regions and the drain regions are doped with impurities.

Next, an interlayer insulating film 160 may be formed on the gate insulating film 140, the switching gate electrode 125a, and the driving gate electrode 125b. The interlayer insulating film 160 may be formed as an organic or inorganic film, and deposited over the entire surface of the substrate 110. Next, the interlayer insulating film 160 and the gate insulating film 140 may be patterned by photolithography by using a third mask to form a plurality of contact holes 61, 62, and 63.

Next, a data metal layer may be formed on the interlayer insulating film 160. The data metal layer may be formed as a multilayer film in which a metal film including one of copper (Cu), a copper alloy, aluminum (Al), and an aluminum alloy and a metal film including either one of molybdenum (Mo) and an molybdenum alloy are laminated. For example, the data metal layer may be formed of a three-layered film of Mo/Al/Mo or a three-layered film of Mo/Cu/Mo.

Next, the data metal layer film may be patterned by photolithography by using a fourth mask. As such, formed on the interlayer insulating film 160 may be a data wire including a data line 171 having a switching source electrode 176a, a driving voltage line 172 having a driving source electrode 176b and a second storage capacitor plate 178, and a switching drain electrode 177a and a driving drain electrode 177b that are connected to the first storage capacitor plate 128.

Next, a protective film 180 may be formed on the interlayer insulating film 160 to cover the data wire 171, 172, 174, 177a, and 177b. At this point, a pixel defining film 180a may be formed by photolithography by using a fifth mask so as to protrude higher than a peripheral protective film 180b by a protrusion height d, and a contact hole 181 may be formed in the protective film 180. The pixel defining film 180a and the peripheral protective film 180b having different heights may be simultaneously formed by using a half-tone mask.

Next, as shown in FIG. 5, a pixel electrode layer may be formed on the pixel protective film 180a, and the pixel electrode layer may be patterned by photolithography by using a sixth mask to form a pixel electrode 710 connected to the driving drain electrode 177b through the contact hole 181. Next, a pixel defining film 350 may be formed on the protective film 180 to cover the pixel electrode 710, and an opening 351 may be formed on the pixel defining film 350 by using a seventh mask to expose part of the pixel electrode 710. At this point, the pixel defining film 180a may be formed to protrude higher than the peripheral protective film 180b by the protrusion height d. Thus, a cross-section of the opening sidewall 350a may have a concave rounded shape.

Next, a donor film 10 may be positioned above the pixel defining film 350. The donor film 10 may have a structure in which a base film 11, a heat conversion layer 12, and a transfer layer 13 are sequentially laminated.

The base film 11 may be made of a material which is transparent and has suitable optical properties and sufficient mechanical stability to transfer a laser to the heat conversion layer 12. For example, the base film 11 may be made of at least one polymer selected from the group of polyester, polyacryl, polyepoxy, polyethylene, polystyrene, and polyethylene terephthalate, or glass.

The heat conversion layer 12 may be a layer for absorbing light in infrared to visible light region and partially converting the light to heat, should have appropriate optical density, and preferably includes a light-absorbing material for absorbing light. The heat conversion layer 12 may be made of a metal layer formed of Ag, Al and their oxides and their sulfides, or an organic layer formed of a polymer material including carbon black, graphite, or infrared dye.

The transfer layer 13 may be partially separated from the donor film 10 by heat energy transferred from the heat conversion layer 12, and transferred onto the pixel electrode 710 to form an organic emission layer 720.

Accordingly, the transfer layer 13 of the donor film 10 may be disposed so as to face the pixel electrode 710 through the pixel defining film 350 and the opening 351.

Next, as shown in FIG. 6, a laser 1 may be irradiated to the donor film 10, so that the transfer layer 13 of the donor film 10 is expanded and transferred onto the pixel electrode 710. Accordingly, a laser irradiating part of the transfer layer 13 may be separated from the heat conversion layer 12 and transferred onto the pixel electrode 710 and may serve as the organic emission layer 720, and a non-laser irradiating part 810 thereof may remain attached to the heat conversion layer 12 as it is.

At this point, due to the concave rounded shape of the opening sidewall 350a of the pixel defining film 350, the organic emission layer 720 and the opening sidewall 350a may be expanded and transferred in a convex shape are brought into close contact with each other and hence no space may be formed between them. Accordingly, the organic emission layer may be prevented from coming off.

By way of summation and review, a method for forming an organic emission layer in such an organic light emitting diode display may include a Laser Induced Thermal Imaging (LITI) process. In the LITI process, a laser beam generated from a laser beam generator may be patterned using a mask pattern, and the patterned laser beam may be irradiated onto a donor film including a base film and a transfer layer to transfer part of the transfer layer on a pixel electrode and form an organic emission layer. Thus, the organic emission layer may be finely patterned.

The pixel electrode may be exposed through an opening in a pixel defining film. A sidewall of the opening of the pixel defining film may have a slope in a cross-sectional view, and the sidewall may have a stepped portion formed on a sidewall boundary where the sidewall meets the pixel electrode. The stepped portion may be bent in a convex shape abruptly at a predetermined angle. The organic emission layer transferred on the sidewall boundary having such a convex stepped portion may partially break and come off due to the convex stepped portion of the sidewall boundary. For example, a surface area of the sidewall of the opening may be larger than a surface area of the organic emission layer transferred on the opening sidewall due to the convex stepped portion of the sidewall boundary. As a result, the organic emission layer may partially break and come off later upon transferring the organic emission layer.

According to an embodiment, a cross-section of the sidewall of the opening in the pixel defining film may have a rounded shape, because of the protruding shape of the pixel protective film positioned under the pixel electrode, thereby preventing the organic emission layer from coming off when transferred.

For example, the sidewall of the opening may have a concave rounded shape, and the organic emission layer and the sidewall may be expanded and transferred in a convex shape. Thus, the sidewall and the organic emission layer may be brought into close contact with each other, and no space is formed between them, thereby preventing the organic emission layer from coming off.

The embodiments provide an organic light emitting diode display capable of preventing an organic emission layer from coming off when transferred and a manufacturing method thereof.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 10: donor film | 350: pixel defining film |
| 350a: opening sidewall | 710: pixel electrode |
| 720: organic emission layer | 730: common electrode |

What is claimed is:

1. An organic light emitting diode display, comprising:
   a substrate;
   a plurality of thin film transistors on the substrate;
   a protective film covering the plurality of thin film transistors;
   a pixel electrode on the protective film;
   a pixel defining film on the protective film, the pixel defining film having an opening exposing the pixel electrode;
   an organic emission layer on the pixel electrode and the pixel defining film; and
   a common electrode covering the organic emission layer,
   wherein a cross-section of an opening sidewall of the opening in the pixel defining film has a rounded shape, and
   wherein the protective film includes a pixel protective film, the pixel protective film underlying the pixel electrode such that outer edges of the pixel protective film are substantially aligned with outer edges of the pixel electrode.

2. The organic light emitting diode display of claim 1, wherein the pixel protective film protrudes away from the substrate.

3. The organic light emitting diode display of claim 2, wherein:
   the protective film further includes a peripheral protective film at sides of the pixel protective film, and
   a height of the pixel protective film measured from a surface of the substrate is greater than a height of the peripheral protective film measured from the surface of the substrate.

4. The organic light emitting diode display of claim 1, wherein the cross-section of the opening sidewall has a concave shape.

5. The organic light emitting diode display of claim 4, wherein an angle of a slope between a tangent at the opening sidewall and a surface of the pixel electrode increases as the tangent at the opening sidewall is farther from a sidewall boundary between the opening sidewall and the pixel electrode.

6. The organic light emitting diode display of claim 5, wherein a second angle of a slope between a tangent at the opening sidewall distal to the sidewall boundary is larger than a first angle of a slope between a tangent at the opening sidewall proximate to the sidewall boundary.

7. The organic light emitting diode display of claim 3, wherein a side of the pixel protective film that is closest to the substrate is coplanar with a side of the peripheral protective film that is closest to the substrate.

8. The organic light emitting diode display of claim 7, wherein an upper surface of the pixel protective film is flat and is coplanar with a lower surface of the pixel electrode.

9. The organic light emitting diode display of claim 7, wherein the pixel protective film directly contacts the pixel electrode.

10. A manufacturing method of an organic light emitting diode display, the method comprising:
    forming a plurality of thin film transistors on a substrate;
    forming a protective film on the plurality of thin film transistors;
    forming a pixel electrode on the protective film;
    forming a pixel defining film on the protective film such that the pixel defining film has an opening exposing the pixel electrode;
    forming an organic emission layer on the pixel electrode and the pixel defining film; and
    forming a common electrode on the organic emission layer,
    wherein a cross-section of an opening sidewall of the opening in the pixel defining film has a rounded shape, and
    wherein the protective film includes a pixel protective film, the pixel protective film underlying the pixel electrode such that outer edges of the pixel protective film are substantially aligned with outer edges of the pixel electrode.

11. The method of claim 10, wherein the pixel protective film protrudes away from the substrate.

12. The method of claim 10, wherein the cross-section of the opening sidewall has a concave shape.

13. The method of claim 10, wherein forming the organic emission layer includes:
    disposing a transfer layer of a donor film so as to face the pixel defining film and the pixel electrode exposed through the opening; and
    irradiating a laser to the donor film to transfer the transfer layer of the donor film onto the pixel electrode.

* * * * *